United States Patent [19]

Paranjpe

[11] Patent Number: 5,494,526

[45] Date of Patent: Feb. 27, 1996

[54] METHOD FOR CLEANING SEMICONDUCTOR WAFERS USING LIQUIFIED GASES

[75] Inventor: Ajit P. Paranjpe, Plano, Tex.

[73] Assignee: Texas Instruments Incorporated, Dallas, Tex.

[21] Appl. No.: 434,727

[22] Filed: May 4, 1995

Related U.S. Application Data

[63] Continuation of Ser. No. 225,164, Apr. 8, 1994, abandoned.

[51] Int. Cl.$^6$ ................................................ B08B 3/12
[52] U.S. Cl. ........................ 134/1; 134/21; 134/31; 134/33; 134/902
[58] Field of Search ........................ 134/1–3, 21, 11, 134/31, 33, 902

[56] References Cited

U.S. PATENT DOCUMENTS

| | | | |
|---|---|---|---|
| 4,695,327 | 9/1987 | Grebinski | 134/11 |
| 4,816,080 | 3/1989 | Binder et al. | 134/10 |
| 4,962,776 | 10/1990 | Liv et al. | 134/11 |
| 5,013,366 | 5/1991 | Jackson et al. | 134/1 |
| 5,115,576 | 5/1992 | Roberson, Jr. et al. | 134/21 X |
| 5,137,580 | 8/1992 | Honda | 134/1 |
| 5,180,438 | 1/1993 | Hockh et al. | 134/21 |
| 5,201,960 | 4/1993 | Starov | 134/11 |
| 5,273,589 | 12/1993 | Griswold et al. | 134/21 |
| 5,286,657 | 2/1994 | Bran | 134/1 X |
| 5,316,591 | 5/1994 | Chao et al. | 134/34 |

OTHER PUBLICATIONS

Edward Bok, Dieter Kelch, Kevin S. Schumacher, "Supercritical Fluids for Single Wafer Cleaning," Solid State Technology, Jun. 1992, vol. 35, Issue 6, pp. 117–120.

*Primary Examiner*—David L. Lacey
*Assistant Examiner*—Sean Vincent
*Attorney, Agent, or Firm*—Jacqueline J. Garner; Richard L. Donaldson; William E. Hiller

[57] ABSTRACT

A semiconductor processing system (10) is provided that comprises a cleaning chamber (12) and a load lock wafer handler chamber (14). A cleaning agent (34) is placed in a cleaning bath chamber (28). A semiconductor substrate (16) is placed in contact with the cleaning agent (34). Cleaning agent (34) is initially in a liquid phase and is caused to change to a vapor phase so that the cleaning agent (34) can penetrate the topography of the surface to be cleaned. Cleaning agent (34) is then returned to a liquid phase and finally flash-evaporated to complete the cleaning process.

16 Claims, 1 Drawing Sheet

METHOD FOR CLEANING SEMICONDUCTOR WAFERS USING LIQUIFIED GASES

This application is a Continuation, of application Ser. No. 08/225,164, filed Apr. 8, 1994, now abandoned.

TECHNICAL FIELD OF THE INVENTION

This invention relates in general to the field of semiconductor processing and more particularly to an improved system and method for cleaning semiconductor substrates using liquefied gases.

BACKGROUND OF THE INVENTION

Cleaning the surface of semiconductor substrates is a critical step in the integrated circuit fabrication process. Surface cleaning eliminates particulates and trace surface contaminations such as organic and metallic impurities. Traditionally, these cleaning techniques have been based almost entirely on chemical reagents, which selectively remove the surface contaminants and particulates without attacking or chemically altering the wafer surface. As the permissible concentrations of contaminants scale down with increasing device integration density, these traditional "wet" cleans are becoming increasingly supplanted by "dry" cleans which employ a vapor phase medium for the clean. Wet cleaning techniques also suffer from the limitation that liquid cleaning materials cannot penetrate the intricate topologies associated with the small geometries encountered in modern integrated circuits. Dry cleans also enjoy an advantage that they are compatible with the concept of integrated single wafer processing which emphasizes the need to isolate the wafer from an uncontrolled ambient during the fabrication sequence. In contrast, wet cleaning is performed at ambient pressure in an atmospheric environment. Contamination of the wafer surface is more likely in such an atmosphere. In addition, chemical waste generated by wet cleaning processes requires elaborate and expensive waste management.

Considerable progress has been made in developing dry or vapor phase cleans that are effective in removing some forms of contamination. In particular, vapor phase cleans are effective in the removal of native oxides and organic impurities. However, progress in the removal of metallic contaminants such as nickel, chromium, iron, zinc, and generic particulates has been more modest. Wet cleaning steps are usually used to remove these forms of contaminants.

Conventional wet cleaning systems use megasonic agitation in a solvent bath followed by rinsing and spin drying to remove particulates and contaminants from the wafer surface. Unless the particulates and contaminants can be volatilized, traditional vapor phase processing is incapable of removing the particulates and contaminants. Gas phase chemistries used to remove metallic contaminants must volatilize the impurities for effective removal. Halogen gases are effective in removing trace quantities of some metallic contaminants. $O_2/O_3$ can remove some organic contaminants and HF/alcohols can remove native oxide. Nevertheless, there does not exist any cleaning process that combines the advantages of dry cleaning with the effectiveness of wet cleaning.

SUMMARY OF THE INVENTION

Accordingly, a need has arisen for a semiconductor processing system and method of operation that substantially eliminates or reduces disadvantages associated with prior systems. According to one embodiment of the present invention, a method for cleaning the surface of a semiconductor substrate is provided that comprises the steps of introducing a cleaning agent onto the surface of the semiconductor substrate in a liquid phase. The wafer with the liquid phase cleaning agent in contact with the surface to be cleaned is then agitated. The cleaning agent is then caused to change into a vapor phase and is flash-evaporated by adjusting the temperature or pressure of the cleaning agent. This process may be repeated to achieve complete removal of contaminants and particulates.

According to an alternate embodiment of the present invention, a semiconductor processing system is provided that comprises a wafer chuck for holding a semiconductor substrate in a cleaning agent bath. Megasonic vibrators are provided to megasonically agitate the bath and the wafer semiconductor substrate. The wafer chuck bath and the semiconductor substrate are disposed within an evacuated cleaning chamber. A source gas system is provided for introducing a cleaning agent into the bath. An evacuation system is provided for rapidly removing the cleaning agent from the cleaning chamber after the cleaning agent has been flash-evaporated. The evacuation pump is coupled to the cleaning chamber for rapidly changing the pressure within the chamber to cause the cleaning agent to change from a liquid phase to a vapor phase. Systems are provided for controlling the temperature of the bath chamber and the semiconductor substrate to also control flash evaporation of the cleaning agent.

BRIEF DESCRIPTION OF THE DRAWINGS

A more complete understanding of the teachings of the present invention may be acquired by referring to the attached FIGURE wherein.

DETAILED DESCRIPTION OF THE INVENTION

Figure 1:
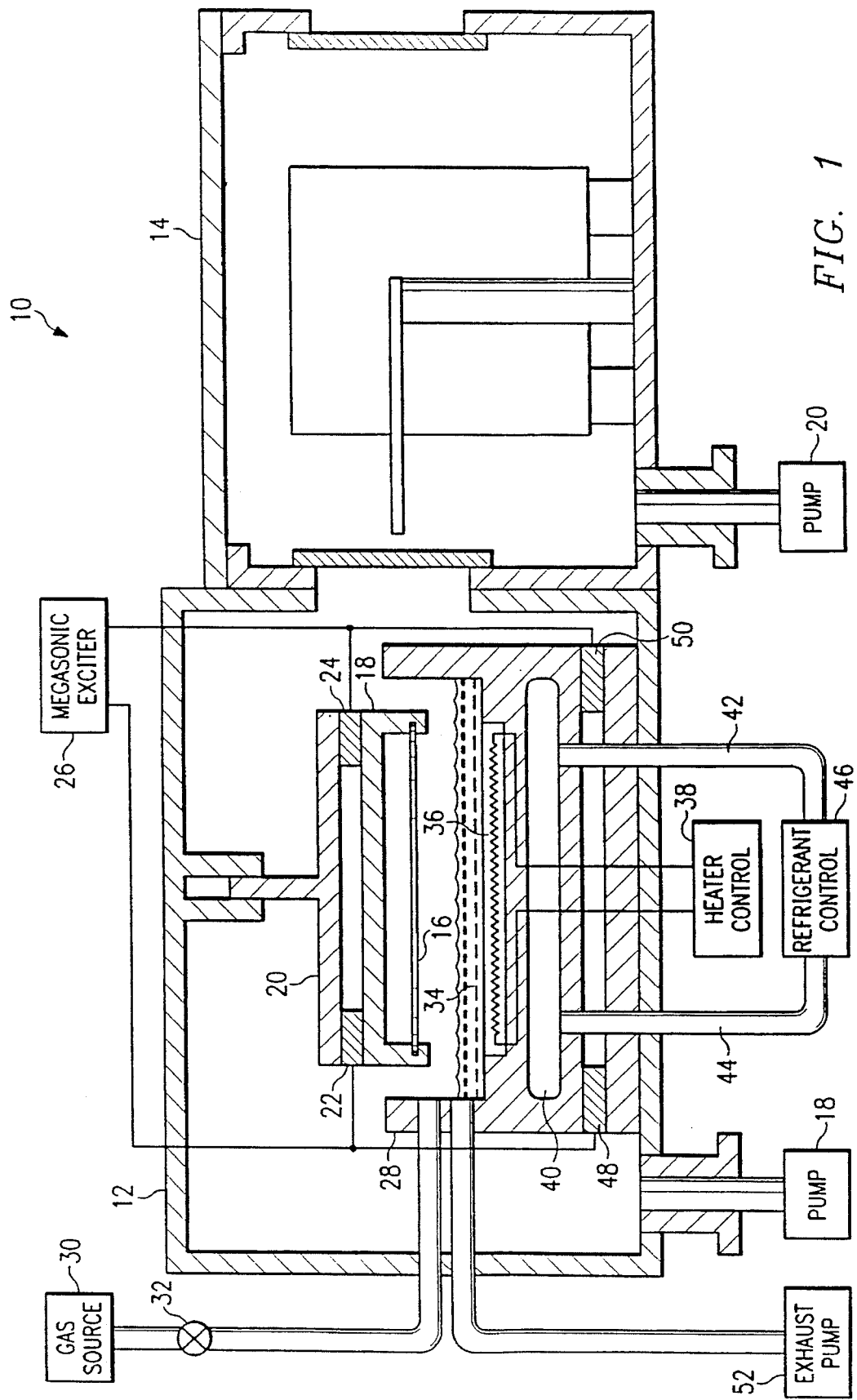
FIG. 1 is a cross-sectional schematic illustration of a semiconductor processing system constructed according to the teachings of the present invention.

Referring to FIG. 1, a semiconductor cleaning system indicated generally at 10 is illustrated. Cleaning system 10 comprises a cleaning chamber 12 and a load lock wafer handler chamber 14. Cleaning chamber 12 functions to use the teachings of the present invention to remove surface contaminants from the surface of a semiconductor substrate 16 shown in FIG. 1. Load lock wafer handler 14 functions to retrieve substrates such as substrate 16 from cleaning chamber 12 and to route them to other semiconductor processes without exposing substrate 16 to atmospheric contaminants. The pressure within cleaning chamber is in part controlled by an evacuation pump 18. Similarly, the pressure within load lock wafer handler chamber 14 is controlled by an evacuation pump 20.

Semiconductor substrate 16 is held in a wafer chuck 19. Wafer chuck 19 is coupled to a wafer chuck manipulator 21 through piezoelectric ultrasonic exciters 22 and 24. Exciters 22 and 24 are electrically coupled to a megasonic exciter 26 which supplies electrical signals to exciters 22 and 24 to cause wafer chuck 19 and semiconductor substrate 16 to megasonically vibrate when exciters 22 and 24 are activated by megasonic exciter 26. Wafer chuck manipulator 21 is movably coupled to chamber 12 such that the semiconductor substrate 16 can be moved in a vertical direction in and out of bath chamber 28. According to one embodiment of the present invention, wafer chuck manipulator 21 is also able to rapidly spin wafer chuck 19 and substrate 16 during the cleaning process. Wafer chuck 19 and substrate 16 may also be temperature controlled in one embodiment by using an embedded heater in wafer chuck 19.

Bath chamber 28 is coupled to a gas source 30 through a control valve 32. Gas source 30 selectively introduces liquefied gas into the bath chamber 28. System 10 in FIG. 1 is illustrated as having a small quantity of liquefied gas indicated as 34 disposed within bath chamber 28. The phase of the cleaning agent 34 is controlled in part by the pressure within cleaning chamber 12 which is controlled by pump 18 and delivery pressure of gas source 30. The phase of cleaning agent 34 is also controlled by controlling the temperature of bath chamber 28 and cleaning agent 34. A heating element 36 is disposed as shown in the base of bath chamber 28. Heating element 36 is electrically coupled to a heater control unit 38. The temperature of the cleaning bath chamber 28 is further controlled by circulating refrigerant into a refrigerant passage 40. Refrigerant passage 40 is coupled by refrigerant lines 42 and 44 to a refrigerant control unit 46. Refrigerant control 46 causes refrigerants such as liquid nitrogen to be circulated through the base of bath chamber 28 to rapidly reduce the temperature of the cleaning agent 34.

Bath chamber 28 is coupled to the chamber 12 through additional piezoelectric ultrasonic exciters 48 and 50. Exciters 48 and 50 are electronically coupled megasonic exciter 26 and function in a similar manner to exciters 22 to megasonically agitate the cleaning bath chamber 28 and simultaneously megasonically excite the cleaning agent 34 disposed in the bath chamber 28.

As will be described herein, the system 10 of the present invention functions to clean the surface of substrate 16 while cleaning agent 34 is in a liquid phase. During surface cleaning, the contamination on substrate 16 becomes dissolved or suspended in cleaning agent 34. Cleaning agent 34 is then changed to a vapor phase by flash evaporation to remove the contaminants that are dissolved or suspended in the cleaning agent. This flash-evaporation is caused by rapidly dropping the pressure using pump 18 as the cleaning agent 34 including any dissolved or suspended contaminants is removed using an exhaust pump 52 which is in direct communication with the interior of the bath chamber 28. This cleaning cycle may be repeated to ensure complete removal of contaminants. In the case of multiple cycles, chamber 12 may not be fully evacuated between cycles. The residual gases then fill the fine features in the topography of substrate 16. These residual gases condense inside these fine features during the next cycle when the fresh batch of liquefied gases is introduced. This ensures that cleaning agent 34 is in intimate contact with the entire surface of substrate 16. In conventional wet cleaning practice surface tension forces prevent cleaning agent 34 from entering the fine features on substrate 6. This prevents effective contaminant removal from the inside of fine features on substrate 16.

In operation, a cleaning agent is introduced from gas source 30 through valve 32 into bath chamber 28. Ordinarily, the cleaning agent is introduced in liquid phase and the pressure within cleaning chamber 12 is kept at an appropriate pressure to keep the cleaning agent 34 in a liquid phase. Alternatively, the gases may be introduced in gaseous phase and the pressure in chamber 12, and temperature of bath chamber 28, wafer chuck 19 and substrate 16 adjusted to condense the gases to a liquid phase to form cleaning agent 34. In this embodiment, intimate contact between cleaning agent 34 and substrate 16 is ensured even for the first cleaning cycle. The semiconductor substrate 16 is lowered into the liquid cleaning agent 34.

According to one embodiment of the present invention, the interface between the semiconductor substrate 16 and the cleaning agent 34 is then agitated using a variety of methods. According to one embodiment of the present invention, the wafer chuck 19 and the bath chamber 28 are megasonically agitated using the piezoelectric ultrasonic exciters 22, 24, 48 and 50 as described previously. In addition, the wafer chuck handler 21 can be rotated rapidly to spin the semiconductor substrate 16 within the liquid cleaning agent 34. The rapid agitation of the cleaning agent and the semiconductor substrate 16 will cause the formation of gas if the temperature and pressure are close to the phase transition conditions between the liquid phase and vapor phase for the particular cleaning agent. The cleaning agent 34 can be kept close to the phase transition by adjusting the temperature of cleaning agent 34 and the pressure within cleaning chamber 12. Agitation causes a small amount of gas to form which then enters the small topography associated with the surface of semiconductor substrate 16. After the agitation ceases, the gas returns to the liquid phase.

In this manner, the advantages associated with dry cleaning techniques using vapor phase cleaning agents are combined with the advantages of the wet cleaning techniques. The vapor phase cleaning agent is allowed to penetrate the intricate topography of the semiconductor substrate surface and then return to a liquid phase to remove particulates and contaminants. According to this embodiment, the exhaust pump 52 and the pump 18 are then used to rapidly drop the pressure so that the cleaning agent 34 flash-evaporates and the particulates and contaminants are forcibly ejected from the surface of substrate 16. The flash-evaporation causes the particulates to be ejected from the surface in such a manner that the particulates are not redeposited onto the surface of substrate 16. Instead they are removed from bath chamber 28 along with the cleaning agent 34 through exhaust pump 52.

In the alternative, the heater control 38, heater element 36, refrigerant control 46, refrigerant channel 40 and heating elements within wafer chuck 19 can be used to rapidly change the temperature of the substrate 16 to cause a similar sequential condensation of the cleaning agent and flash-evaporation of the cleaning agent. Further, the combined use of temperature and pressure cycling can cause even faster and complete flash-evaporation of the cleaning agent 34 from the surface of the substrate 16.

According to an alternate embodiment of the present invention, the cleaning agent 34 is introduced in a liquid phase. The pump 18 and the heater element 36 are then used to drop the pressure and increase the temperature within the cleaning chamber 12, respectively, to cause the cleaning agent to briefly change into the vapor phase. This process enables the cleaning agent to penetrate the intricate topography of the surface of the semiconductor substrate 16. After a short period of time, the pressure within chamber 12 is once again raised and the refrigerant control 36 and refrigerant channel 40 are used to return the cleaning agent to a liquid phase. In the liquid phase, the cleaning agent 34 can be agitated as described previously. The cleaning cycle is completed by the flash-evaporation of the cleaning agent 34 using the methods described previously.

It should be understood that the amount of cleaning agent 34 shown in FIG. 1 is not to scale with respect to the dimensions of substrate 16. A very small amount of cleaning agent is actually required to perform the cleaning operation of the present invention. Only a thin film of liquid is needed to remove particulate contaminants from the surface of the semiconductor substrate. The rapid evaporation of the cleaning agent 34 will be greatly enhanced if only a minimum amount of cleaning agent is used.

The system of the present invention can use a variety of cleaning agents 34 provided by gas source 30. For example, for the removal of particulate matter, liquefied argon or nitrogen can be used. Particulate removal by megasonic agitation or via spray cleaning using a liquid depends primarily on the surface tension of the liquid, whether the molecules of the liquid are polar or non-polar, and the pH of the liquid. Typically particulate removal efficiencies are better for liquids with low surface tension and non-polar or alkaline liquids. Lower surface tension liquids wet the particulates and this wetting action lifts the particulate from the surface thereby reducing the adhesion between the particulate and the surface. Surface tension decreases with increasing temperature and is zero at the boiling point. Thus liquefied gases are more effective in particulate removal than conventional liquid reagents especially if the megasonic agitation is performed at temperatures approaching the boiling point. Thus liquefied gases are more effective in particulate removal than conventional reagents especially if the megasonic agitation is performed at temperatures approaching the boiling point. In addition, the two phase (liquid/gas) flow conditions that accompany boiling can impart additional energy to the wafer surface dislodging particulates. Thermophoretic forces also contribute to particulate removal. Several non-polar (e.g. $N_2$, $O_2$, $CO_2$) or alkaline (e.g. $NH_3$) liquified gases are suitable for particulate removal.

For the removal of organic contaminants, liquefied carbon dioxide or any of the freon family of gases can be used. A variety of other organic gases can also be used to dissolve and remove organic contaminants. The system of the present invention can also be used to remove metallic contaminants by using liquefied hydrochloric acid, hydrofluoric acid or sulphur dioxide. Ionic dissociation of several acidic liquefied gases (e.g. HCL, $HB_r$, HF, $SO_3$) is significant at cryogenic temperatures. In some cases such as for HCL the ionic concentrations may be too high. Thus, it may be necessary to dilute or buffer the liquefied gases with other inert liquefied gases or alkaline liquefied gases such as ammonia. The use of these highly caustic compounds can be buffered by using liquefied ammonia or other alkaline agents to balance the acidity of the cleaning agent. This buffering will prevent the cleaning agent from attacking the internal surfaces of cleaning chamber 12 and can be also used to carefully control the damage to the semiconductor substrate 16 caused during the cleaning process.

An important technical advantage of the cleaning system 10 of the present invention is the fact that the cleaning utilizes a liquid phase cleaning operation but occurs in a controlled ambient environment. Accordingly, the cleaning chamber 12 can be coupled through load lock wafer handler 14 to other atmospherically controlled processes. For example, load lock wafer handler chamber 14 can be used to transfer semiconductor substrate 16 from the cleaning chamber 12 into a variety of other processes, including etch processes, rapid thermal processes, or other cleaning processes such as plasma cleaning operations using ultraviolet light and the like.

A further technical advantage of the present invention is the fact that it capitalizes on the best attributes of both dry and wet cleaning operations. The system of the present invention causes a cleaning agent to cross the phase transition between gas and liquid during the cleaning operation. The vapor phase is used to penetrate the intricate topographies of the surface to be cleaned and the cleaning agent is then returned to the liquid phase to cause the removal of the contaminants and particulate matter. The megasonic and other agitation methods used in conventional wet cleans can be used in conjunction with the system of the present invention when the cleaning agent used in the system of the present invention is in the liquid phase. Further, the cleaning agent is flash-evaporated to complete the process so that none of the cleaning agent or the contaminants remain on the wafer and the wafer may be transferred to other processes.

Although the present invention has been described in detail, it should be understood that various changes, alterations, substitutions and modifications may be made to the systems and methods described herein without departing from the spirit and scope of the present invention which is solely defined by the appended claims.

What is claimed is:

1. A method for cleaning a surface of a semiconductor substrate having contaminants embedded in a surface thereof comprising the steps of:

introducing a cleaning agent into a cleaning bath in a liquid phase;

bringing the surface of the semiconductor substrate having said contaminants into contact with the liquid cleaning agent;

causing the cleaning agent to change to a vapor phase such that the cleaning agent penetrates the topology of the surface of the substrate;

returning the cleaning agent in said surface to a liquid phase; and flash-evaporating the cleaning agent in said liquid phase and said bath to both eject said contaminants from the surface of the substrate and remove the evaporated cleaning agent and contaminants removed from the surface of the substrate and the cleaning bath.

2. The method of claim 1 wherein the step of causing the cleaning agent to change to the vapor phase comprises the step of agitating the cleaning agent to cause portions of the cleaning agent to locally change to the vapor phase and to dislodge said contaminants from the substrate surface.

3. The method of claim 2 wherein the step of agitating the cleaning agent comprises the step of megasonically exciting the cleaning bath and megasonically exciting the semiconductor substrate.

4. The method of claim 2 wherein the step of agitating the cleaning agent comprises the step of rapidly spinning the semiconductor substrate when the substrate is in contact with the cleaning agent.

5. The method of claim 1 wherein the step of causing the cleaning agent to change to the vapor phase comprises the step of altering the pressure of the environment of the cleaning agent to cause the cleaning agent to change to the vapor phase.

6. The method of claim 1 wherein the step of causing the cleaning agent to change to the vapor phase comprises the step of changing the temperature of the cleaning agent to cause the cleaning agent to change to the vapor phase.

7. The method of claim 1 wherein the step of introducing a cleaning agent comprises the step of introducing a non-polar material into the cleaning bath to remove particulate matter from the surface of the substrate.

8. The method of claim 1 wherein the step of introducing a cleaning agent comprises the step of introducing a polar material into the cleaning bath to remove particulate matter from the surface of the substrate.

9. The method of claim 1 wherein the step of introducing a cleaning agent comprises the step of introducing liquid acidic material buffered with an alkaline material.

10. The method of claim 1 wherein the step of introducing a cleaning agent comprises the step of introducing liquid hydrofluoric acid buffered with ammonia.

11. The method of claim 1 wherein the step of introducing a cleaning agent comprises the step of introducing a liquid organic material.

12. The method of claim 1 wherein said steps of introducing the cleaning agent, bringing the surface of the semiconductor substrate into contact with the liquid cleaning agent, causing the cleaning agent to change, returning the cleaning agent to a liquid phase, and flash-evaporating are repeated.

13. A method for cleaning a surface of a semiconductor substrate having contaminants embedded in a surface thereof comprising the steps of:

introducing a cleaning agent into a cleaning bath in a liquid phase;

bringing the surface of the semiconductor substrate having said contaminants into contact with the liquid cleaning agent;

causing the cleaning agent to momentarily change to a vapor phase by megasonically exciting the cleaning bath and megasonically exciting the semiconductor substrate such that the cleaning agent penetrates the topology of the surface of the substrate;

returning the cleaning agent inside surface to a liquid phase; and flash-evaporating the cleaning agent in said liquid phase and said bath by rapidly reducing the pressure to both eject said contaminants from the surface of the substrate and remove the evaporated cleaning agent and contaminants removed from the surface of the substrate and the cleaning bath.

14. The method of claim 13 wherein the step of causing the cleaning agent to change to the vapor phase further comprises the step of altering the pressure of the cleaning agent to cause the cleaning agent to change to the vapor phase.

15. The method of claim 13 wherein the step of causing the cleaning agent to change to the vapor phase comprises the step of changing the temperature of the cleaning agent to cause the cleaning agent to change to the vapor phase.

16. The method of claim 13 wherein said steps of introducing the cleaning agent, bringing the surface of the semiconductor substrate having said contaminants into contact with the liquid cleaning agent, causing the cleaning agent to momentarily change, returning the cleaning agent to a liquid phase, and flash-evaporating are repeated.

* * * * *